United States Patent [19]

Devins

[11] Patent Number: 4,513,346

[45] Date of Patent: Apr. 23, 1985

[54] MEANS TO IMPROVE THE DIELECTRIC PERFORMANCE OF AN INSULATIVE CONDUIT WITH A FLOW OF LIQUID DIELECTRIC COOLANT THEREIN

[75] Inventor: John C. Devins, Saratoga, N.Y.

[73] Assignee: General Electric Company, Schenectady, N.Y.

[21] Appl. No.: 488,913

[22] Filed: Apr. 27, 1983

Related U.S. Application Data

[63] Continuation of Ser. No. 259,396, May 10, 1981, abandoned.

[51] Int. Cl.³ ............................................. H05F 3/00
[52] U.S. Cl. .................................... 361/212; 361/215; 361/382; 361/385
[58] Field of Search ................ 361/212, 215, 382, 385

[56] References Cited

U.S. PATENT DOCUMENTS

| 3,248,636 | 4/1966 | Colaiaco | 361/382 X |
| 3,473,087 | 10/1969 | Slade | 361/215 |
| 3,586,959 | 6/1971 | Eccles et al. | 361/385 X |
| 3,651,865 | 3/1972 | Feldmanis | 361/385 X |
| 3,907,955 | 9/1975 | Viennot | 361/215 X |

Primary Examiner—Reinhard J. Eisenzopf
Attorney, Agent, or Firm—Bernard J. Lacomis; James C. Davis, Jr.

[57] ABSTRACT

In high voltage electrical equipment, improvement in the dielectric performance of an insulative conduit having a flow of liquid dielectric coolant therein is effected by providing a suitably selected low conductance path in contact with the dielectric coolant.

22 Claims, 5 Drawing Figures

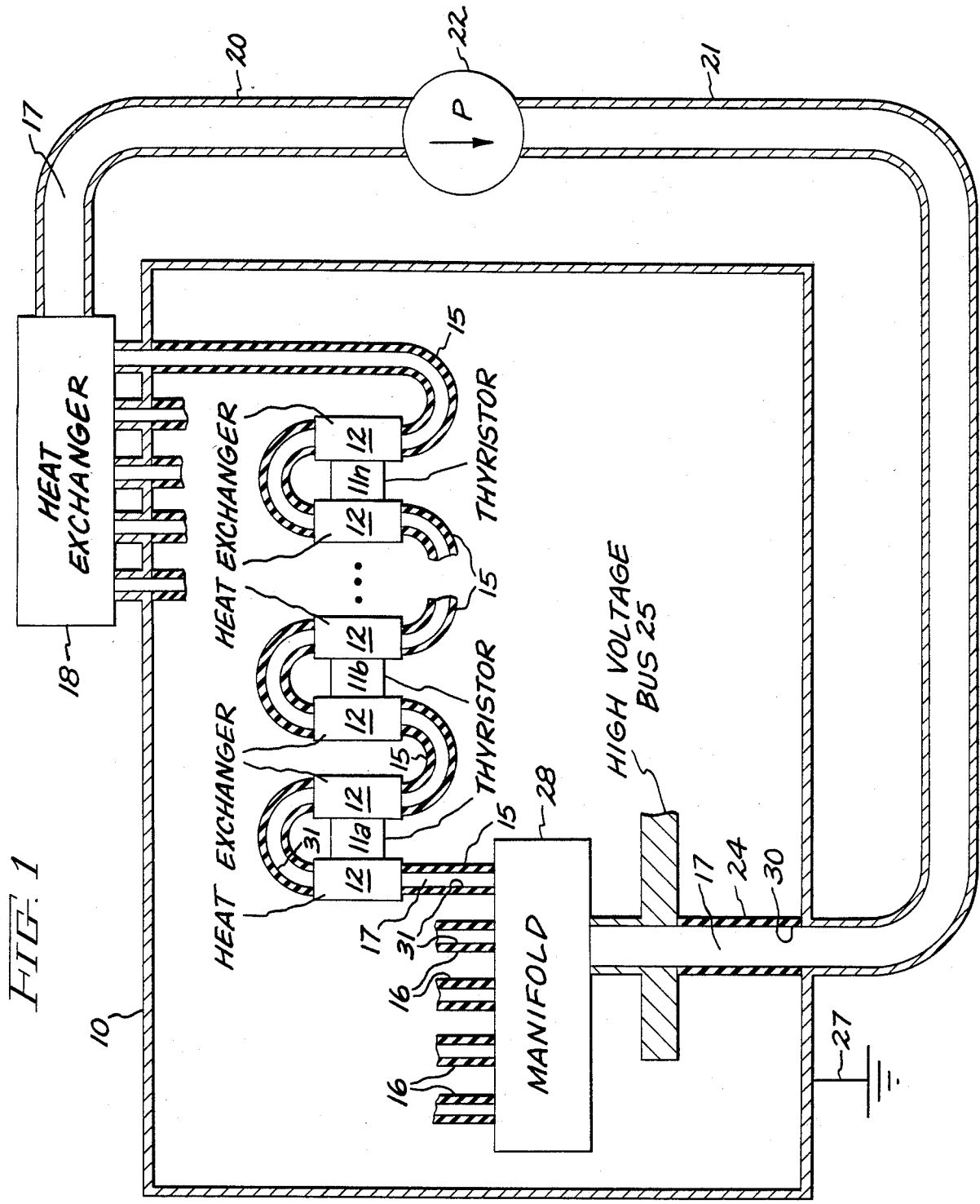

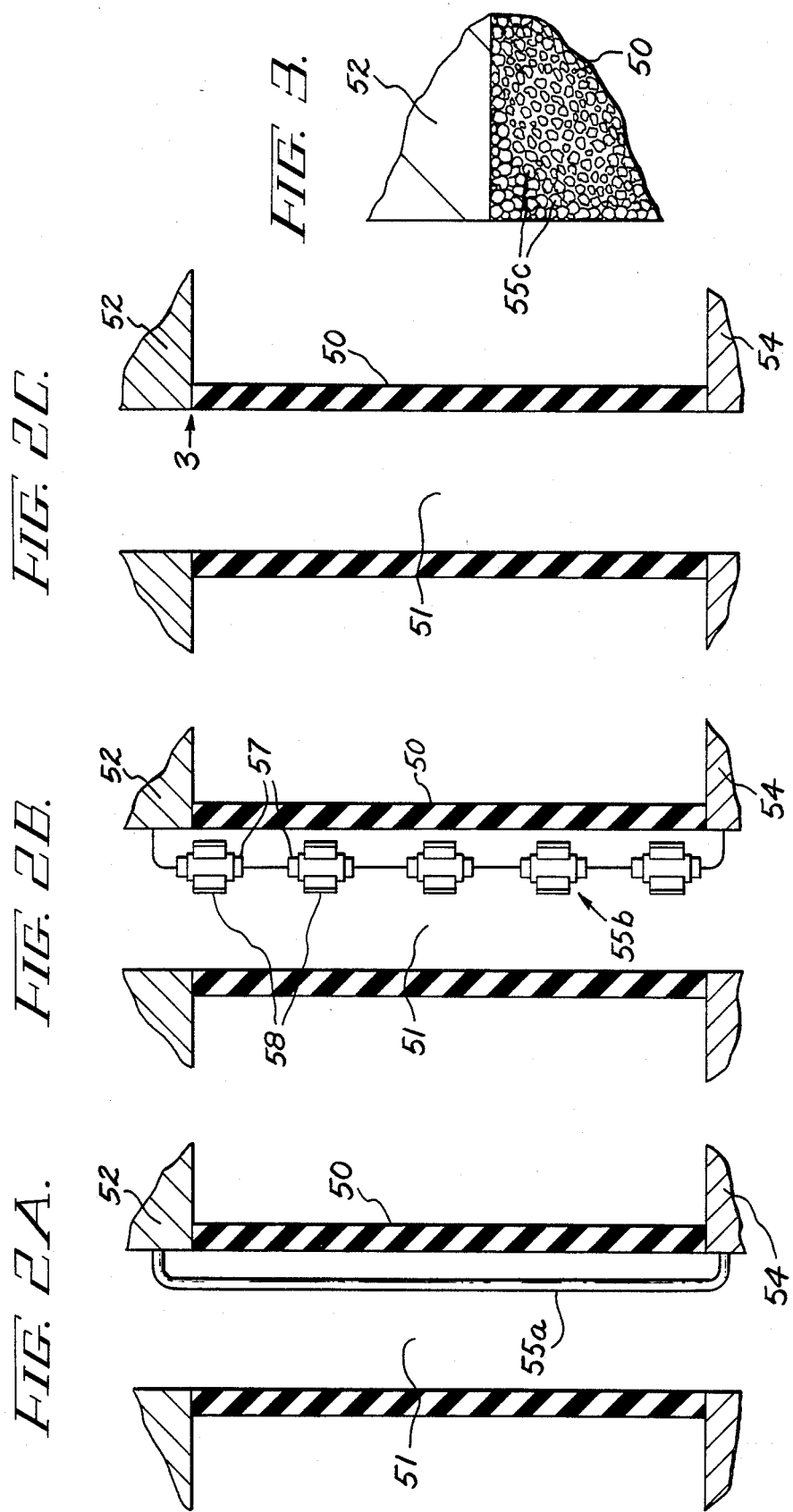

MEANS TO IMPROVE THE DIELECTRIC PERFORMANCE OF AN INSULATIVE CONDUIT WITH A FLOW OF LIQUID DIELECTRIC COOLANT THEREIN

This application is a continuation, of application Ser. No. 259,396, filed 5/1/81, now abandoned.

CROSS-REFERENCE TO A RELATED APPLICATION

The present application is related to copending U.S. patent application Ser. No. 140,244, J. C. Devins (the present inventor) et al., filed on Apr. 14, 1980, entitled "Additives to Prevent Electrostatic Charge Buildup in Fluids in High-Voltage Systems", and assigned to the same assignee as is the present application now abandoned, a continuation-in-part application Ser. No. 360,264 filed Mar. 22, 1982, having been filed thereon.

BACKGROUND OF THE INVENTION

The present invention relates to means to improve the dielectric performance of an insulative conduit and a liquid dielectric coolant which flows within the insulative conduit in high voltage equipment (that is, equipment utilizing a power level voltage) and, more particularly, to such means where the improved aspects of dielectric performance comprise the reduction of electrostatic charge buildup in the liquid dielectric coolant and the predetermination of the voltage gradient along the insulative conduit having the liquid dielectric coolant therein.

High voltage electrical equipment has begun to utilize cooling means comprising an insulative conduit having a flow of liquid dielectric coolant therein. In such electrical equipment, it is typical for a high voltage or potential difference to be present between two conductors which are spaced along the length of the insulative conduit and which make contact with the liquid dielectric coolant. Thus, the high voltage is impressed across the dielectric coolant between these conductors. The insulative conduit (and also the liquid dielectric coolant flowing therein) are designed to accommodate the high voltage between the foregoing two conductors. A degradation in the performance of either dielectric can lead to puncturing of the insulative conduit with the attendant loss of coolant function of the electrical equipment.

A problem which has been known to occur regarding degradation of the performance of a liquid dielectric coolant which flows within an insulative conduit is as follows. A liquid dielectric coolant usually contains electrically charged ions, some being positively charged and some being negatively charged. Depending upon the properties of the materials of the insulative conduit and of the liquid dielectric coolant, charged ions of one or the other electrical sign become absorbed on the inner wall of the insulative conduit. The oppositely-charged ions are carried "upstream" in the flow of liquid dielectric coolant, and are neutralized by a conductor of the electrical equipment. The separation of the oppositely-charged ions results in an electrostatic voltage, with respect to the gound of the electrical equipment, appearing along the length of the insulative conduit. Such electrostatic voltage can interact with the high voltage preexisting between two conductors which are spaced along the length of the insulative conduit and which are in contact with the liquid dielectric coolant. The resulting or cumulative voltage along the length of the insulative conduit can exceed the dielectric capacity of the insulative conduit, and thereby degrade the dielectric performance of the insulative conduit. The high voltage impressed across the two spaced apart conductors can then very rapidly or catastrophically deteriorate the insulative conduit and result in puncturing therethrough.

One prior art means for reducing the electrostatic charge buildup in a liquid dielectric coolant involves the introduction of a small amount of ionic additive to the liquid delectric coolant. Such a prior art means is described and claimed in the above-referenced, copending patent application.

A system for the delivery of fuel through an insulative conduit in a jet aircraft has experienced the problem of electrostatic charge buildup resulting in a punctured fuel conduit. It is to be noted, however, that the foregoing insulative conduit was not provided with spaced conductors in contact with the fuel and having a voltage impressed therebetween, as is the case with the above-described high voltage electrical equipment. A means employed to avoid the problem of punctured fuel conduits involves the provision of paths of high conductance in a fuel conduit, as, for example, by providing high conductivity fillers in the material of the fuel conduit. Such a means cannot be utilized for high voltage electrical equipment inasmuch as a high conductance path would adversely interfere with the dielectric properties of an insulative conduit having a flow of liquid dielectric fluid therein and which is subject to a high voltage along the length of the insulative conduit.

It would therefore be desirable to provide means to reduce the electrostatic charge buildup in an insulative conduit having a liquid dielectric coolant therein which means does not impair the dielectric properties of the insulative conduit having the flow of liquid dielectric coolant therein.

A problem regarding degradation of the dielectric performance of the insulative conduit is as follows. The insulative conduit typically comprises a glass-epoxy composition having a very high resistivity on the order of $10^{16}$ to $10^{17}$ ohm centimeters, or even higher. It is difficult to precisely control the constituent elements of such a glass-epoxy composition to achieve a resistivity within a desirable, narrow range. The thickness of the insulative conduit wall also has a bearing on the resistivity of the insulative conduit, although the thickness can usually be well controlled. The resistivity along the length of the insulative conduit determines the voltage gradient along the length of the insulative conduit between the two spaced apart conductors. The voltage gradient is the highest along regions of the insulative conduit having the highest resistivity. The electric "stress" imposed on the insulative conduit varies according to the voltage gradient therealong. Accordingly, a region of high voltage gradient along the insulative conduit will cause a high electric stress to be imposed upon such region of the insulative conduit. This region of high electric stress can cause premature and catastrophic deterioration of the conduit in this region, with the attendant loss of cooling function of the electrical equipment.

A prior art means for overcoming the problem of the variations of resistivity along the insulative conduit involves the lengthening of the insulative conduit, whereby the maximum regions of electric stress along the insulative conduit are reduced to a value that can be accommodated by the insulative conduit. It would be desirable, however, to provide a means for predetermining the voltage gradient along the length of the insulative conduit. This would result in the ability to preclude regions of significantly higher than average electric stress along the insulative conduit, whereby the length of an insulative conduit can be shortened from the length utilized with the foregoing prior art means. The shortening of an insulative conduit would save on costs for the following materials: the insulative conduit, the amount of liquid dielectric coolant required, and the size of a container in which to house the insulative conduit.

OBJECTS OF THE INVENTION

Accordingly, it is an object of the present invention to provide means to improve the dielectric performance of a liquid dielectric coolant flowing within an insulative conduit in high voltage electrical equipment.

A further object of this invention is to provide means to reduce the electrostatic voltage buildup in a liquid dielectric coolant flowing within an insulative conduit in high voltage electrical equipment.

Another object of this invention is to provide means to predetermine the voltage gradient along an insulative conduit having a flow of liquid dielectric coolant therein and which is used in high voltage electrical equipment.

Further objects and advantages of the present invention will become apparent from a reading of this specification in conjunction with the drawing figures.

SUMMARY OF THE INVENTION

The objects of the present invention are carried out in electrical equipment having an insulative conduit with a liquid dielectric coolant flowing therein and wherein a high, or power level, voltage is impressed between two conductors which are spaced along the length of the insulative conduit and which are in contact with the liquid dielectric coolant. The present invention provides means to improve the dielectric performance of the foregoing insulative conduit with the flow of liquid dielectric coolant therein. This means comprises a low conductance path connected between the two spaced conductors and which is in communication with the liquid dielectric coolant. The low conductance path has a minimum conductance in excess of about the conductance value corresponding to a resistance per unit length of the low conductance path of 5 times $10^8$ ohms per centimeter. The low conductance path serves to conduct charged ions away from the liquid dielectric coolant and the walls of the insulated conduit, whereby electrostatic charge buildup in the liquid dielectric coolant is reduced.

BRIEF DESCRIPTION OF THE DRAWING FIGURES

FIG. 1 is a diagrammatic representation in cross-section of high voltage electrical equipment incorporating the present invention;

FIGS. 2A-2C are diagrammatic representations in cross-section of insulative conduits with respective flows of liquid dielectric coolant therein illustrating alternative implementations for the inventive low conductance path; and FIG. 3 is an enlarged fragmentary detail view taken at an arrow 3 in FIG. 2C.

DETAILED DESCRIPTION OF THE INVENTION

FIG. 1 illustrates application of the present invention to high voltage electrical equipment comprising a thyristor convertor bridge which is useful for converting AC electrical power to DC electrical power, or vice versa. Contained within a metallic housing 10 are thyristors 11a, 11b, . . . , 11n, arranged on a panel (not shown). These thyristors 11a-11n are electrically interconnected to form a "bridge" for implementing their function of electrical power conversion. These thyristors 11a-11n develop large amounts of heat which must be removed in order to assure proper functioning thereof.

In order to cool the thyristors 11a-11n, heat exchangers 12 are respectfully paired on both sides of each thyristor. A flow of liquid dielectric coolant 17 is circulated through the heat exchangers 12 by means of insulative conduits 15 comprising, for example, Tefzel polymer tubing. Tefzel material is a copolymer of polytetrafluoroethylene and polypropylene. The flow of liquid dielectric coolant 17 has a general direction from left to right in FIG. 1. The liquid dielectric coolant 17 typically comprises Freon 113 coolant or Freon 113 TF coolant.

The liquid dielectric coolant 17, after flowing through the right-most heat exchanger 12 for the thyristor 11n, flows into a further heat exchanger 18 wherein heat is removed therefrom. The liquid dielectric coolant 17 is pumped through metallic conduits 20 and 21 by a pump 22. The liquid dielectric coolant 17 is transferred to an insulative conduit 24 where the metallic conduit 21 joins the bottom of the metallic housing 10. The insulative conduit 24 typically is fabricated from a glass-epoxy composition. The liquid dielectric coolant 17, under the pressure of the pump 22, flows upward in the insulative conduit 24 and makes contct with a high voltage "bus" 25. This high voltage bus 25 typically has a DC voltge thereon of 400 kilovolts with respect to the metallic housing 10 as well as to the metallic conduits 20 and 21, all of which are at a common reference or "ground" potential as indicated by the reference symbol 27.

The liquid dielectric coolant 17 passes through the high voltage bus 25 and enters a manifold 28 which distributes the liquid dielectric coolant 17 into a plurality of secondary insulative conduits 15 and 16. The insulative conduits 16 each passes through heat exchangers (not shown) for thyristors (not shown), as is the case with the insulative conduit 15. The heat exchanger 18, similar to the manifold 28, is shown as also having a plurality of insulative conduits which are counterparts for the plurality of insulative conduits connected to the manifold 28. In addition to the insulative conduit 24 and the coolant system connected thereto (that is, the manifold 28, the secondary conduits 15 and 16, and the heat exchangers associated with each secondary conduit 15 and 16), a thyristor converter bridge typically comprises further insulative conduits, similar to the insulative conduit 24, and respective cooling systems connected thereto, which are not illustrated herein.

It is observed that the liquid dielectric coolant 17 flowing in the insulative conduit 24 makes contact with two conductors spaced along the length of the insulative conduit 24. These conductors are the high voltage bus 25 and the metallic conduit 21, or equivalently for electrical purposes, the bottom of the metallic housing 10. The voltage gradient along the insulative conduit 24, between the foregoing, spaced apart conductors, by way of example, is in excess of about 10 volts per mil where the insulative conduit 24 has a length between the spaced conductors of 86 centimeters. In accordance with the present invention, a low conductance path 30 is provided within the insulative conduit 24 and is connected between the foregoing two conductors. The low conductance path 30 comprises a conductive coating, such as graphite, on the interior surface of the insulative conduit 24. The low conductance path 30 has a minimum conductance in excess of about the conductance value corresponding to a resistance per unit length of the low conductance path 30 of 5 times $10^8$ ohms per centimeter. The conductance of the low conductance path 30 is limited to a maximum value, however, as discussed in the next paragraph. The present inventor has discovered that a low conductance path 30 having the foregoing minimum conductance is able to promote the neutralization of absorbed ions on solid surfaces within the insulative conduit 24 due to transfer of electrical charge between the low conductance path 30 and such absorbed ions. Such neutralization of absorbed ions is promoted to a material degree whereby the buildup of electrostatic voltage in the dielectric coolant 17 is substantially reduced and the attendant risk of a punctured insulative conduit 24 is substantially minimized.

The low conductance path 30 has a conductance which is limited to a maximum value which is sufficiently low to limit resistance heating therein to a tolerable level. What is a tolerable level depends on the heating tolerance for the affected materials (for example, the insulative conduit 24 and the liquid dielectric coolant 17) in the particular electrical equipment involved. By way of example, for the present thyristor converter bridge with the high voltage bus 25 at 400 kilovolts and the low conductance path 30 having a length of 86 centimeters, the conductance of the low conductance path 30 should be limited to a maximum conductance corresponding to a resistance per unit length of the low conductance path 30 of $2 \times 10^7$ ohms per centimeter whereby the resistance heating of the low conductance path 30 amounts to approximately 100 watts.

With the conductance of the low conductance path 30 within the range determined by the foregoing two factors, the dielectric performance of the insulative conduit 24 with the liquid dielectric coolant 17 therein is not impaired. Quite to the contrary, the dielectric performance of the insulative conduit 24 with the liquid dielectric coolant 17 therein can be appreciably enchanced by the provision of the low conductive path 30. This is because the "resistivity" of the low conductive path 30 is several orders of magnitude lower than the resistivity of the insulative conduit 24. As such, the resistivity of the low conductance path 30 effectively determines the voltage gradient between the high voltage bus 25 and the ground potential at 27. The resistivity of the low conductive path 30 can be much more easily controlled than the resistivity of the insulative conduit 24. Accordingly, regions of significantly higher than average voltage gradient with the attendant higher than average electric stress along the insultative conduit 24 can be avoided. As a consequence of this fact, the length of the insulative conduit 24 can be shortened from the length determined by the prior art means for accommodating the different resistivities of the insulative conduit 24.

The present invention also has application to the insulative conduits 15 inasmuch as each of these conduits has a liquid dielectric coolant 17 therein which makes contact with a pair of conductors spaced along the length of the insulative conduit 15 and which has a high or power level voltage impressed therebetween. For example, the insulative conduit 15 between the manifold 28 and the heat exchanger 12 for the thyristor 11a has a pair of spaced apart conductors along the length thereof which are at different electrical potentials. The liquid dielectric coolant 17 in this insulative conduit 15 makes contact with the high voltage bus 25 through the manifold 28 in the typical situation where it is electrically connected to the bus 25 and also to the left-most heat exchanger 12 for the thyristor 11a. Such left-most heat exchanger is at an electrical potential which is different from that of the high voltage bus 25 due to its connection to the thyristor 11a. The thyristor 11a has a different potential from that of the high voltage bus 25 as a result of its being connected into the thyristor converter bridge.

In accordance with the present invention, the insulative conduit 15 are provided with low conductance paths 31. The minimum conductance of the low conductance paths 31 is in excess of about the conductance value corresponding to a resistance per unit length of the low conductance path 31 of 5 times $10^8$ ohms per centimeter, as is the case with the low conductance path 30. The conductance of the low conductance path 31 is limited to a maximum value which is sufficiently low to limit resistance heating in the insulative conduits 15 to a tolerable level. By way of example, for the present thyristor converter bridge, a tolerable level of resistance heating is in the range between about 5 and 10 watts. The advantages attained from the application of the present invention to the insulative conduit 24, as described above, apply equally well to the application of the present invention to the insulative conduits 15.

Turning to FIG. 2A, there is shown an alternative means for implementing a low conductance path in accordance with the present invention. An insulative conduit 50 has a flow of liquid dielectric coolant 51 therein. Conductors 52 and 54 are spaced along the length of the insulative conduit 50, make contact with the liquid dielectric coolant 51, and have a high voltage impressed therebetween. The low conductance path 55a is implemented with a porcelain rod connected between the conductors 52 and 54 and having a semiconducting glaze thereon, such as silicon.

FIG. 2B illustrates the same structure as in FIG. 2A except for a different implementation of a low conconductance path 55b. The low conductance path 55b comprises a plurality of series-connected resistors 57 connected between the conductors 52 and 54. The resistors 57 may be provided with metallic fins 58 to facilitate the collection of charged ions by the resistors 57. The resistors 57 are preferably wire-wound resistors which are compatible with the liquid dielectric coolant 51.

FIG. 2C shows the same structure as the preceding FIGS. 2A and 2B except for the implementation of a low conductance path. The low conductance path in the arrangement of FIG. 2C comprises a conductive filler embedded in the material of the insulated conduit 50. Such conductive filler preferably comprises conductive particles 55c, as illustrated in the enlarged view of FIG. 3 taken at an arrow 3 in FIG. 2C. The conductive particles suitably comprise one of the following materials: carbon, copper oxide, tin oxide, vanadium oxide, or silver oxide.

While the invention has been described with respect to specific embodiments, modifications thereof will occur to persons skilled in the art. For example, high voltage electrical equipment other than the thyristor converter bridge described above can benefit for the present invention. For example, gas-filled transformers which employ a liquid dielectric coolant flowing in an insulative conduit and having two conductors spaced along the insulative coolant, and having a voltage impressed therebetween can benefit from the invention. The foregoing and all such modifications are deemed to fall within the true spirit and scope of the invention as defined in the appended claims.

What is claimed as my invention and desired to be secured by Letters Patent of the United States is:

1. An apparatus to improve the dielectric performance of an insulative conduit containing a flowing liquid dielectric coolant therein, wherein a high voltage is impressed between two conductors which are spaced along the length of said insulative conduit, which conductors are in contact with said liquid dielectric coolant, said apparatus comprising:
a low conductance path connected between said two spaced conductors and in contact with said liquid dielectric coolant, said low conductance path having a minimum conductance in excess of about the conductance value corresponding to a resistance per unit length of said low conductance path of $5 \times 10^8$ ohms/cm.

2. The invention of claim 1 wherein said low conductance path has a conductance sufficiently low for limiting resistance heating therein to below about 100 watts.

3. The invention of claim 1 wherein said low conductance path has a conductance sufficiently low for limiting resistance heating therein to the range between about 5 and 10 watts.

4. The invention of claim 1 wherein said low conductance path comprises a conductive coating on the interior of said insulative conduit.

5. The invention of claim 4 wherein said conductive coating comprises graphite.

6. The invention of claim 1 wherein said low conductance path comprises a rod having a semiconducting portion.

7. The invention of claim 6 wherein said semiconducting portion comprises a semiconducting glaze.

8. The invention of claim 6 wherein said semiconducting portion of said rod comprises silicon.

9. The invention of claim 6 wherein said rod comprises a porcelain substrate.

10. The invention of claim 1 wherein said low conductance path comprises a plurality of serially-connected resistors.

11. The invention of claim 10 wherein said serially-connected resistors comprise wire-wound resistors.

12. The invention of claim 10 further comprising metallic fins disposed on at least one of said resistors.

13. The invention of claim 1 wherein said low conductance path comprises a conductive filler embedded in the interior wall of the material forming said insulative conduit.

14. The invention of claim 13 wherein said conductive filler comprises one of the group consisting of carbon, copper oxide, tin oxide, vanadium oxide, and silver oxide.

15. The invention of claim 1 wherein said liquid dielectric coolant comprises Freon 113 coolant.

16. The invention of claim 15 wherein said Freon coolant comprises one of the group consisting of Freon 113 coolant and Freon 113 TF coolant.

17. The invention of claim 1 or 2 wherein said insulative conduit comprises glass-epoxy.

18. The invention of claims 1 or 3 wherein said insulative conduit comprises a copolymer of polytetrafluoroethylene and polypropylene.

19. The invention of claim 1 wherein the voltage gradient between said two conductors which is due to said high voltage is in excess of about 10 volts per mil.

20. The invention of claim 1 wherein said electrical equipment comprises a thyristor converter bridge.

21. A method for improved insulation of spaced apart electrical conductors operating at a high potential difference which are connected by an insulative fluid conduit carrying a flowing dielectric coolant, said coolnt being in contact with said electrical conductors, said method comprising:
providing a low conductance path between said two spaced apart conductors and in contact with said liquid dielectric coolant, said low conductance path having a minimum conductance in excess of about the conductance value corresponding to a resistance per unit length of said low conductance path of $5 \times 10^8$ ohms/cm.

22. An apparatus to improve the dielectric performance of an insulative conduit containing a flowing liquid dielectric coolant therein, wherein a high voltage is impressed between two conductors which are spaced along the length of said insulative conduit, which conductors are in contact with said liquid dielectric coolant, said apparatus comprising:
a low conductance path connected between said two spaced conductors and in contact with said liquid dielectric coolant, said low conductance path haing a minimum conductance in excess of about the conductance value corresponding to a resistance per unit length of said low conductance path of $5 \times 10^8$ ohms/cm, said low conductance path also having a maximum conductance value corresponding to a resistance per unit length of said low conductance path of about $2 \times 10^7$ ohms/cm.

* * * * *